United States Patent [19]
Marneweck et al.

[11] Patent Number: 6,166,960
[45] Date of Patent: Dec. 26, 2000

[54] METHOD, SYSTEM AND APPARATUS FOR DETERMINING THAT A PROGRAMMING VOLTAGE LEVEL IS SUFFICIENT FOR RELIABLY PROGRAMMING AN EEPROM

[75] Inventors: Willem J. Marneweck, Tempe; Willem Smit, Chandler; Meiling Chen, Tempe, all of Ariz.

[73] Assignee: Microchip Technology, Incorporated, Chandler, Ariz.

[21] Appl. No.: 09/405,450

[22] Filed: Sep. 24, 1999

[51] Int. Cl.[7] ............................. G11C 16/04; G11C 16/06
[52] U.S. Cl. .............................. 365/185.28; 365/185.24; 365/228; 365/229
[58] Field of Search ............................. 365/189.09, 226, 365/228, 229, 185.24, 185.28, 185.18

[56] References Cited

U.S. PATENT DOCUMENTS

| | | | |
|---|---|---|---|
| 5,508,971 | 4/1996 | Cernea et al. | 365/185.23 |
| 5,663,918 | 9/1997 | Javanifard et al. | 365/226 |
| 5,925,139 | 7/1999 | Yamada et al. | 714/14 |
| 6,038,190 | 3/2000 | Kowalski et al. | 365/228 |

*Primary Examiner*—Son Mai
*Attorney, Agent, or Firm*—Baker Botts L.L.P.

[57] ABSTRACT

An electronic system, comprising a digital processor and an EEPROM, has circuit logic and program software or firmware for determining if a programming voltage level is sufficient for reliably programming the EEPROM. A charge pump is enabled and generates a voltage used for programming of the EEPROM. The enabled charge pump thereby loads a battery power supply. In addition, a test load may be connected to the output of the charge pump to simulate the EEPROM load during a programming operation to the EEPROM. The charge pump output voltage is measured to determine if at least a desired voltage value is obtained. Once the charge pump voltage level has been pre-qualified for the desired voltage value, an actual programming operation to the EEPROM may be performed. If the voltage level does not reach the desired value then a programming operation is inhibited and the electronic system may alarm or shut down operation. The charge pump voltage level is a good indication and measure of battery charge condition under actual EEPROM programming load conditions.

48 Claims, 6 Drawing Sheets

FIGURE 4

METHOD, SYSTEM AND APPARATUS FOR DETERMINING THAT A PROGRAMMING VOLTAGE LEVEL IS SUFFICIENT FOR RELIABLY PROGRAMMING AN EEPROM

FIELD OF THE INVENTION

This invention relates generally to programmable non-volatile memories, and more particularly, to the prevention of soft programming to an EEPROM because of insufficient programming voltage during a programming operation.

BACKGROUND OF THE RELATED TECHNOLOGY

Digital electronic systems based on, for example but not limitation, microcontrollers, microprocessors, digital signal processors, programmable logic arrays (PLA), hardwired digital logic and the like, often use a non-volatile memory for permanent storage of program and control data. A preferred type of non-volatile memory is an electrically erasable programmable read only memory (EEPROM). The process of programming an EEPROM cell is lengthy in time compared to the time required to program data to volatile memory such as static and dynamic random access memory (SRAM and DRAM, respectively). In addition, to prevent corruption of programmed data in the EEPROM it is necessary to maintain a minimum programming voltage level throughout the programming cycle. If the programming voltage level is too low, insufficient charge is transferred to the EEPROM cell, causing a "soft programming" of the EEPROM cell. A softly programmed EEPROM cell will loose its charge over time and thus the correct information stored in that memory cell will be corrupted.

In the EEPROM structure, a pair of polysilicon gates are separated by a silicon dioxide layer. In the operation of the EEPROM, a voltage of suitable magnitude is applied across a very thin gate oxide layer which induces tunneling of electrons between the semiconductor substrate and the lower gate of the EEPROM memory cell. The transfer of electrons alters the threshold voltage and consequently the conductivity of the cell, thus determining the logical state of the data stored in the cell. It is imperative that the power supply voltage of the EEPROM be maintained at a sufficiently high voltage level to assure that the programming voltage level is adequate for programming the EEPROM cell completely. Maintaining a sufficient voltage level is especially important in low voltage applications such as battery operated systems using complementary metal-oxide-silicon (CMOS) devices designed to operate at voltages of less than 6 volts and even below 2 volts.

Corruption of data in the EEPROM is of particular concern in applications where the information is critical and the power supply is not always reliable, such as in a battery supply where the battery voltage is subject to low voltage conditions due to discharge of the battery. One such application is in security systems where long term memory without corruption is imperative. Security systems may include vehicle, home and office systems where a low battery condition could occur just when critical data is being programmed to the EEPROM. A security system, especially with a battery supply in a vehicle, may rely on security codes or status flags to determine whether a user is authorized and it is very important that the stored information remain uncorrupted and valid.

Therefore, what is needed is a system, method and apparatus for determining that a programming voltage level is sufficient for reliably programming an EEPROM having non-volatile storage data.

SUMMARY OF THE INVENTION

The invention overcomes the above-identified problems as well as other shortcomings and deficiencies of existing technologies by providing in a digital electronic system having an EEPROM and logic circuits for programming data thereto, a system, method and apparatus for determining that a programming voltage level is sufficient for reliably programming the EEPROM. It is also contemplated and within the scope of the invention that the embodiments of the invention may be equally beneficial when programming flash memory.

In accordance with an embodiment of the present invention, an integrated circuit package comprising an electronic digital logic and control circuit such as a microcontroller, a microprocessor, a digital signal processor and the like, and an EEPROM, has circuits therein for controlling a charge pump which generates a voltage used in programming the EEPROM memory cells, and for monitoring the resulting charge pump voltage before a programming operation to the EEPROM commences. In addition, a test load may also be provided which may be connected to the output of the charge pump so as to simulate the load of a programming operation to the EEPROM. Control and sequencing of the functions of the embodiments of the invention may be performed by a software program, by hardware control logic, or a combination of both (firmware and control logic).

According to the embodiment of the present invention, the charge pump is enabled before an EEPROM programming operation is performed. The charge pump draws current from the battery when operating and if the battery does not have a sufficient charge for a programming operation to the EEPROM, then the charge pump voltage will not be at least a minimum desired voltage value. In addition, a test load may be connected to the charge pump output to simulate the load that would be placed thereon by an actual programming operation to the EEPROM. Thus, an actual load simulation condition will occur for an accurate assessment of the charge pump voltage level which, in this case, is a very reliable indication of battery charge condition. The load simulation could be connected by addressing a programming operation outside of the normal EEPROM address space.

If the desired charge pump voltage is measured and verified before any attempt is made to perform a programming operation to the EEPROM, the chance of soft programming is substantially reduced. In the preferred embodiment, a low voltage check may first be made, (i.e., is there sufficient battery voltage for proper operation of the test and control logic for performing the charge pump output voltage test), then the charge pump that generates the voltage used for programming the EEPROM is switched on, thereby drawing current from the battery. A test load may also be connected to the output of the charge pump to further simulate substantially the same load as that of the programming operation to the EEPROM.

An actual programming operation to the EEPROM is not performed but the charge pump voltage is measured under load conditions. If the measured charge pump voltage is at or above a desired voltage value then there is sufficient charge in the battery and normal operation may continue (i.e., a programming operation to the EEPROM), wherein the charge pump is turned off and the system is ready to program one or more memory locations of the EEPROM. If the measured charge pump voltage is below the desired programming voltage value then the microcontroller may shut down, thus preventing any false operation until the battery supply has been re-charged.

In another embodiment of the invention, the charge pump is enabled, voltage generated therefrom is measured, then the charge pump is turned off and only one programming operation to the EEPROM is enabled, as opposed to more than one programming operation being enabled. This embodiment which requires a test before each programming operation takes more time, but is more thorough in evaluating the battery condition before each programming operation to the EEPROM is enabled. In addition, a test load may be connected to the output of the charge pump during the voltage measurement step (a programming operation to the EEPROM is not being performed while the voltage is being measured).

In still another embodiment of the invention, the charge pump is enabled, voltage therefrom is measured, and if the charge pump voltage level is equal to or greater than a desired voltage value, then one or more programming operations to the EEPROM is enabled. This embodiment has the advantage of speed and may still closely monitor the unloaded charge pump voltage before each programming operation or series of programming operations to the EEPROM. In effect the voltage comparison and logic circuits of this embodiment allow both the voltage level checking and the data programming to the EEPROM memory cell to be performed in one operation (pipelining— no shutdown of the charge pump between voltage checking and writing events). In addition, if the charge pump voltage falls below the desired level, the associated programming operation is inhibited and the microcontroller system may alarm or shut down depending on the software program or hardware logic design of the microcontroller system.

It is contemplated and within the scope of the present invention that all circuits and functions described herein, except for the battery, may be contained in one or more integrated circuits. The preferred embodiments of the present invention are described for illustrative purposes comprising a single integrated circuit, but one of skill in the art of electronics will readily appreciate that the embodiments of the invention may be equally applied to a combination of circuits fabricated in different integrated circuit packages and connected together using a common wiring substrate such as, for example but not limitation, a printed wiring or circuit board.

A feature of the present invention is that the charge pump is independently controllable by, for example, a software program of the microcontroller.

Another feature of the present invention is that the charge pump is independently controllable by hardware control logic.

Another feature of the present invention is that the charge pump is independently controllable by firmware instructions.

Another feature is monitoring of the charge pump voltage before and during any programming operation to the EEPROM.

Still another feature is preventing a programming operation to the EEPROM if the charge pump voltage is not at least a desired value.

Yet another feature is loading the output of the charge pump and measuring the charge pump voltage level which indicates the charge condition of the battery that will be present when programming an EEPROM.

Another feature is measuring the charge condition of the battery by evaluating the voltage level of the charge pump before programming an EEPROM.

Still another feature is measuring the actual charge pump voltage before applying same during a programming operation to the EEPROM.

An advantage of the present invention is the charge pump voltage is pre-qualified therefore preventing soft programming of the EEPROM.

Another advantage is determining the state of the battery charge when under actual load conditions of an operating charge pump.

Yet another advantage is alarming or shutting down the system before a soft programming operation could occur.

Features and advantages of the invention will be apparent from the following description of presently preferred embodiments, given for the purpose of disclosure and taken in conjunction with the accompanying drawings.

DETAILED DESCRIPTION OF THE PREFERRED EMBODIMENTS

The invention is a battery powered digital electronic system having an electronic logic and control circuit, such as an integrated circuit microcontroller, microprocessor, digital signal processor and the like; an EEPROM, logic circuits for programming data thereto, and circuits for determining that the battery power supply voltage level is sufficient for reliably programming the EEPROM. If the battery supplying power to the integrated circuit microcontroller does not have sufficient charge therein to power a charge pump necessary for generating a required voltage level during a programming operation to an EEPROM, the embodiments of the invention will inhibit any programming operation to the EEPROM, thus preventing a possible "soft programming" thereof. The present invention is especially useful in any application requiring reliable data storage, such as in security and industrial control systems.

Referring now to the drawings, the details of preferred embodiments of the invention are schematically illustrated. Like elements in the drawings will be represented by like numbers, and similar elements will be represented by like numbers with a different lower case letter suffix.

Figure 1:
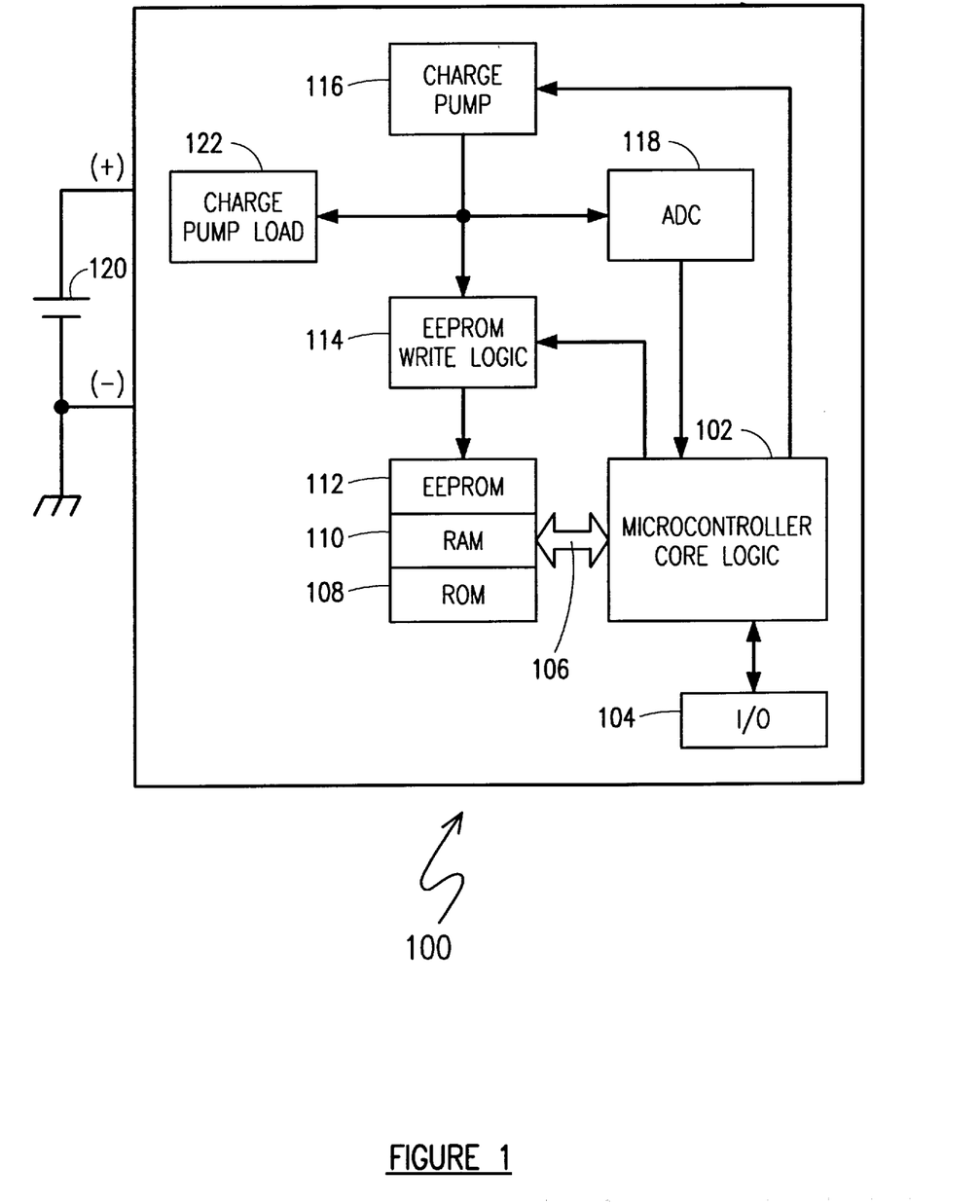
FIGS. 1 and 1A are schematic block diagrams of an electronic system according to embodiments of the invention.
Figure 1A:
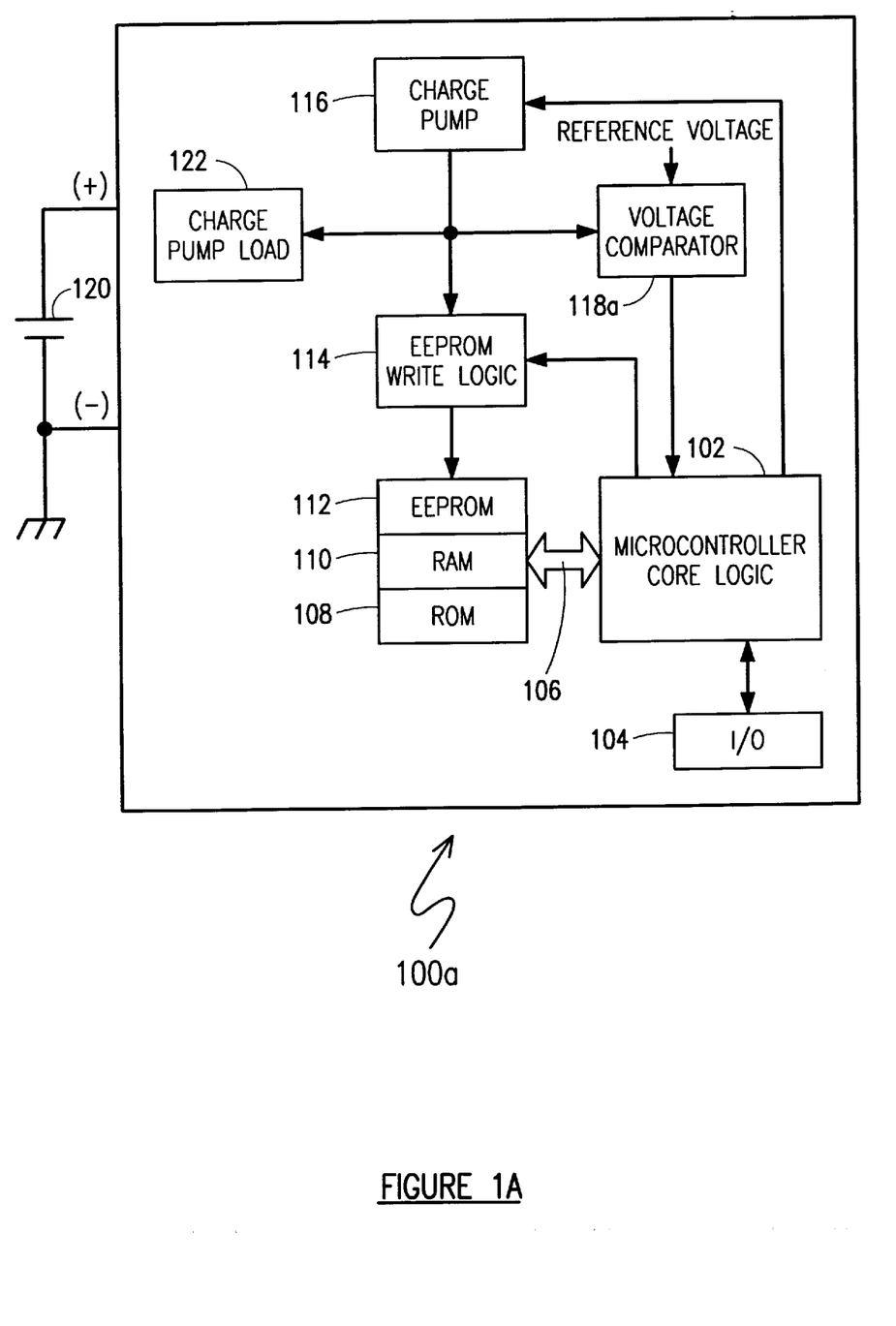

Referring now to FIGS. 1 and 1A, schematic block diagrams of an electronic system, according to embodiments of the invention, are illustrated. An electronic system such as an integrated circuit microcontroller is generally indicated by the numeral 100. The integrated circuit microcontroller comprises microcontroller core logic 102, input-output interface (I/O) 104, a read only memory (ROM) 108, a random access memory (RAM) 110, an electrically erasable programmable read only memory (EEPROM) 112, EEPROM programming logic 114, a charge pump 116, and an analog-to-digital converter (ADC) 118 or voltage comparator 118a (FIG. 1A). In addition, a charge pump load 122 may be included for loading of the charge pump 116 during testing thereof. The EEPROM 112, RAM 110 and/or ROM 108 may be part of the integrated circuit microcontroller 100 or may be in a different integrated circuit(s).

The microcontroller core logic 102 receives sensor input information and controls external devices through the I/O 104 which is also connected to I/O pins on the integrated circuit package (not illustrated). The microcontroller core logic 102 reads program and data information from the ROM 108, RAM 110 and EEPROM 116 over a data and address bus 106. The microcontroller core logic 102 may also program data information to the RAM 110, and controls programming of data information to the EEPROM 112. Information may be stored in the RAM 110 but is volatile, i.e., is lost if power is removed. The ROM 108 contains program instructions and data information which are created at the time of manufacture and cannot be changed in the field, nor during operation of the integrated circuit microcontroller 100.

The EEPROM 112 may be written to during field installation or operation therein by enabling the EEPROM programming logic 114 which causes specific EEPROM memory cells to store a logic 1 or a logic 0. A higher voltage than what is used in normal operation is used to program information to the EEPROM 112. The charge pump 116 generates the required voltage level needed for programming the EEPROM 112. A problem exists, however, if the power supply voltage coming from, for example but not limitation, a battery 120 is not sufficient for proper operation of the charge pump 116, i.e., an adequate voltage level for a proper programming operation is not generated by the charge pump 116, or decays during a write operation.

Typically, the voltage generated by the charge pump is proportional to the battery 120 voltage, and when the battery 120 charge is inadequate for the load of the charge pump, then the charge pump will not produce an adequate voltage level for properly programming the EEPROM 112. Measurement of the battery 120 voltage for a "low voltage" condition without actual charge pump loading may indicate that the battery 120 has sufficient charge, but when a programming operation occurs, the battery voltage may drop under the load of the charge pump 116 and a lower than needed voltage may be generated, thus resulting in soft programming of the EEPROM 112 memory cell. Even prediction of the battery 120 condition from past operations may not detect an inadequately charged battery 120 for a proper EEPROM 112 programming operation in the future. A low voltage check of the actual battery voltage may be performed to insure that the battery 120 has sufficient charge to properly operate the control and test logic of the embodiments of the present invention.

The embodiments of the present invention allow the microcontroller core logic 102 to independently control turning on and off the charge pump 116, and the ADC 118 is utilized to monitor (read) the voltage level value from the charge pump 116 and make the charge pump voltage level value available to the microcontroller core logic 102 in a digital format. The ADC 118 may be used for other purposes in the integrated circuit microcontroller 100 by using an analog multiplexer (not illustrated) ahead of the ADC 118. In FIG. 1A, a voltage comparator 118a is used instead of the ADC 118. A reference voltage for the comparator 118a may be fixed at the time of manufacture of the integrated circuit, or the reference voltage may be programmed (not illustrated) to a desired value by the microcontroller core logic 102.

When the charge pump 116 can be independently controlled by the microcontroller core logic 102, and the output voltage generated by the charge pump 116 monitored, a more realistic determination of the charge condition of the battery 120 may be obtained before any programming operation to the EEPROM 112 is attempted. Once a determination is made that the voltage level generated by the charge pump 116 is adequate for a programming operation to the EEPROM 112, the embodiments of the invention allow the programming operation(s) to proceed. If the voltage level generated by the charge pump 116 is not adequate for a programming operation to the EEPROM 112, (e.g., the battery 120 does not have sufficient charge remaining under charge pump 116 load conditions) the microcontroller core logic 102 may alarm, inhibit any further programming operation to the EEPROM 112, or may shut the entire system down. The embodiments of the invention may be controlled through the microcontroller 100 and a software program, by a hardware logic controller, or by a combination of both (firmware embedded into the ROM 108).

It is contemplated and with the scope of the present invention that all circuits and functions disclosed in FIG. 1, except for the battery, may be contained in one or more integrated circuits. The preferred embodiments of the present invention are described for illustrative purposes comprising a single integrated circuit, but one of skill in the art of electronics will readily appreciate that the embodiments of the invention may be equally applied to a combination of circuits fabricated in different integrated circuit packages and connected together using a common wiring substrate such as, for example but not limitation, a printed wiring or circuit board.

Figure 2:
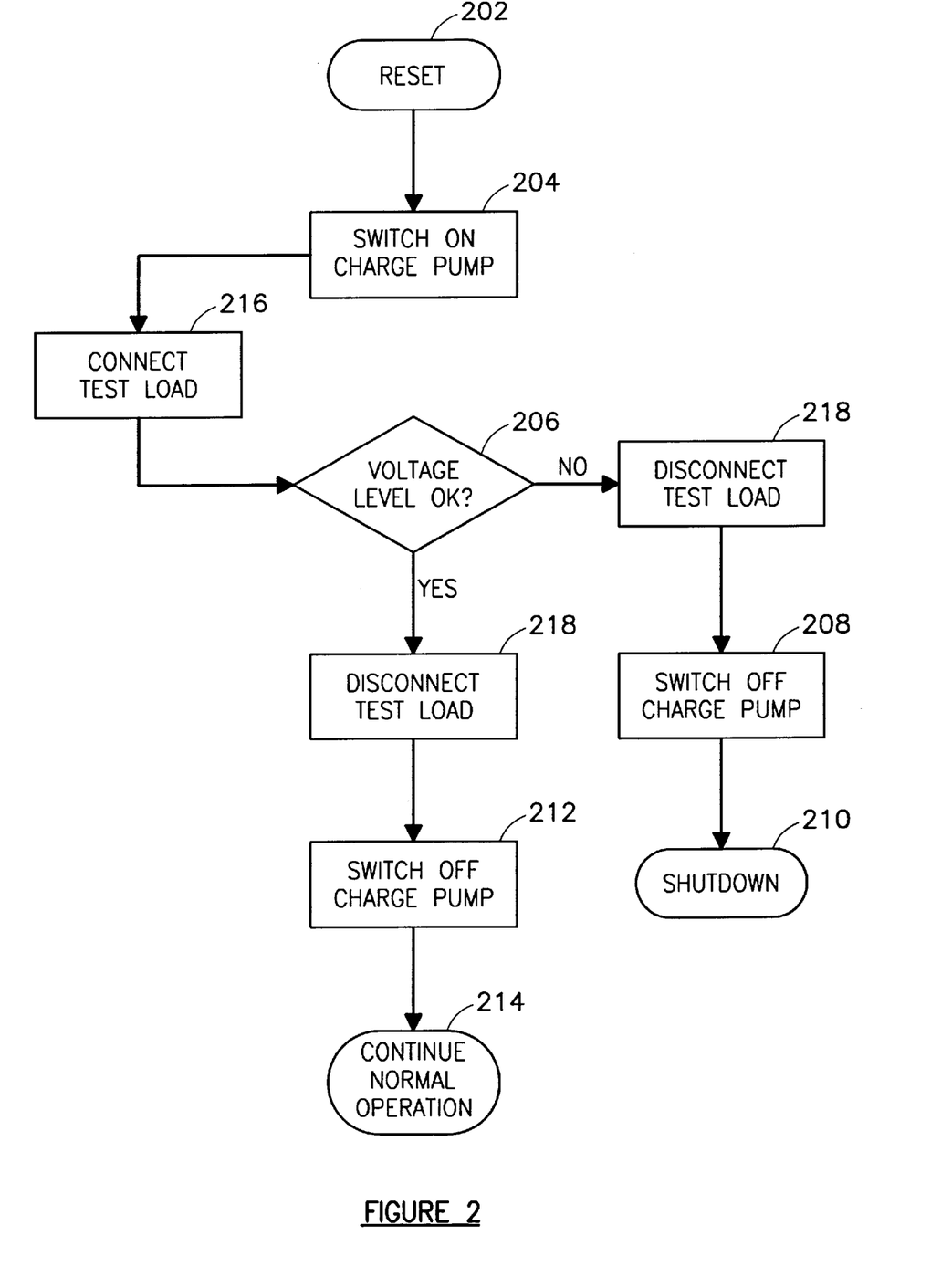
FIGS. 2 and 2A are schematic logic flow diagrams of an embodiment of the invention having independent and separate charge pump voltage checks and programming operations.
Figure 2A:
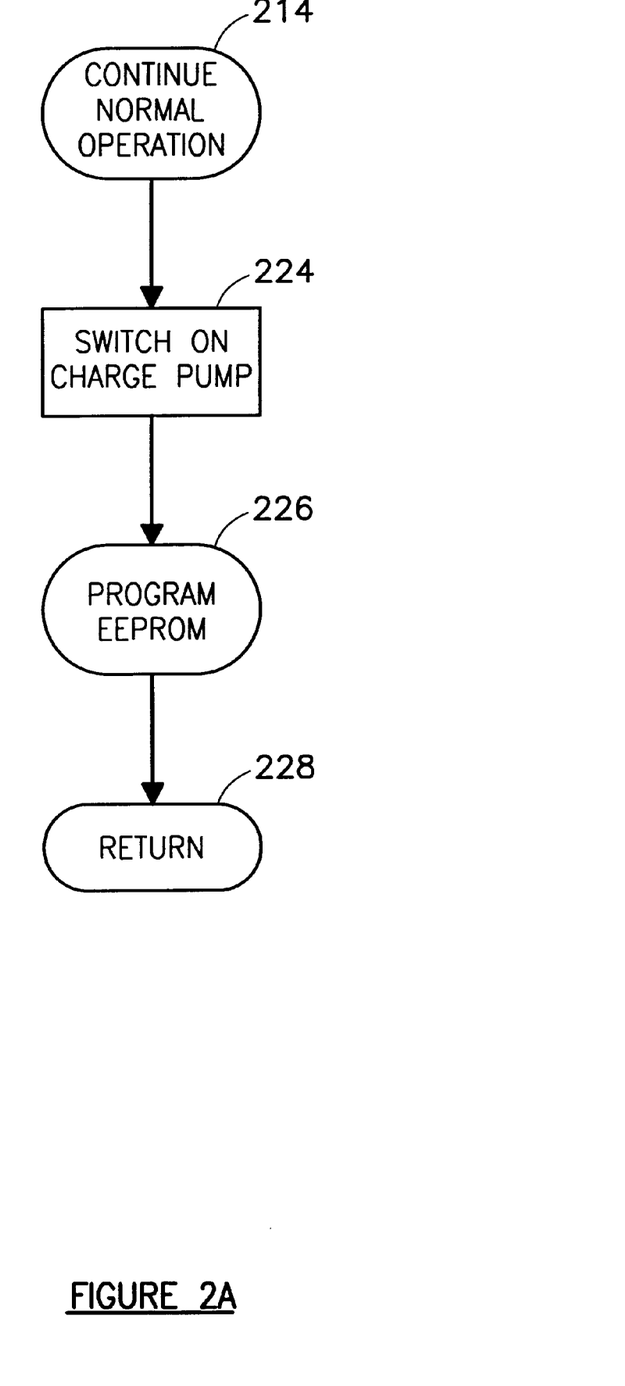

Referring now to FIGS. 2 and 2A, schematic logic flow diagrams of an embodiment of the invention having independent and separate charge pump voltage checks and programming operations are illustrated. In step 202, a reset or initialization is performed by the microcontroller core logic 102. In step 204 the microcontroller core logic 102 causes the charge pump 116 to switch on, thus placing a load on the battery 120. Optionally, a test load (charge pump load 122 of FIG. 1) may be connected to the charge pump in step 216 to create the same load on the charge pump as an actual EEPROM 112 programming operation. This may be accomplished, for example but not limitation, by switching the load 122 to the output of the charge pump 116, or by having the load 122 accessible for programming just like an EEPROM cell by giving it an address in memory space outside of the EEPROM address range.

The voltage level generated by the charge pump 116 is checked in step 206, and if at or greater than a desired voltage value, then the charge pump 116 is switched off in step 212 (test load is disconnected in step 218) and the system is ready to proceed with a normal programming operation to the EEPROM 112 in step 214. If, however, the voltage level generated by the charge pump 116 is less than the desired voltage value, then the charge pump 116 is switched off in step 208 (test load is disconnected in step 218) and the system is shutdown in step 210. It is contemplated and within the scope of the present invention that the system may also, alternatively, alarm or inhibit any attempted programming operation to the EEPROM 112.

A normal programming operation to the EEPROM 112 causes the charge pump to switch on in step 224 (FIG. 2A) and the information to be written to the EEPROM 112 in step 226. After the information is programmed, the system returns in step 228 to the next task. It is contemplated and within the scope of the invention that a single programming operation may occur and then the charge pump output voltage level be tested as disclosed above, or that a series of programming operations may occur before testing the charge pump output voltage. The microcontroller core logic 102 independently controls the operation of the charge pump 116 and monitors the output voltage level thereof so that any algorithm may be implemented or combination thereof under software control, hardware control or a combination thereof.

Figure 3:
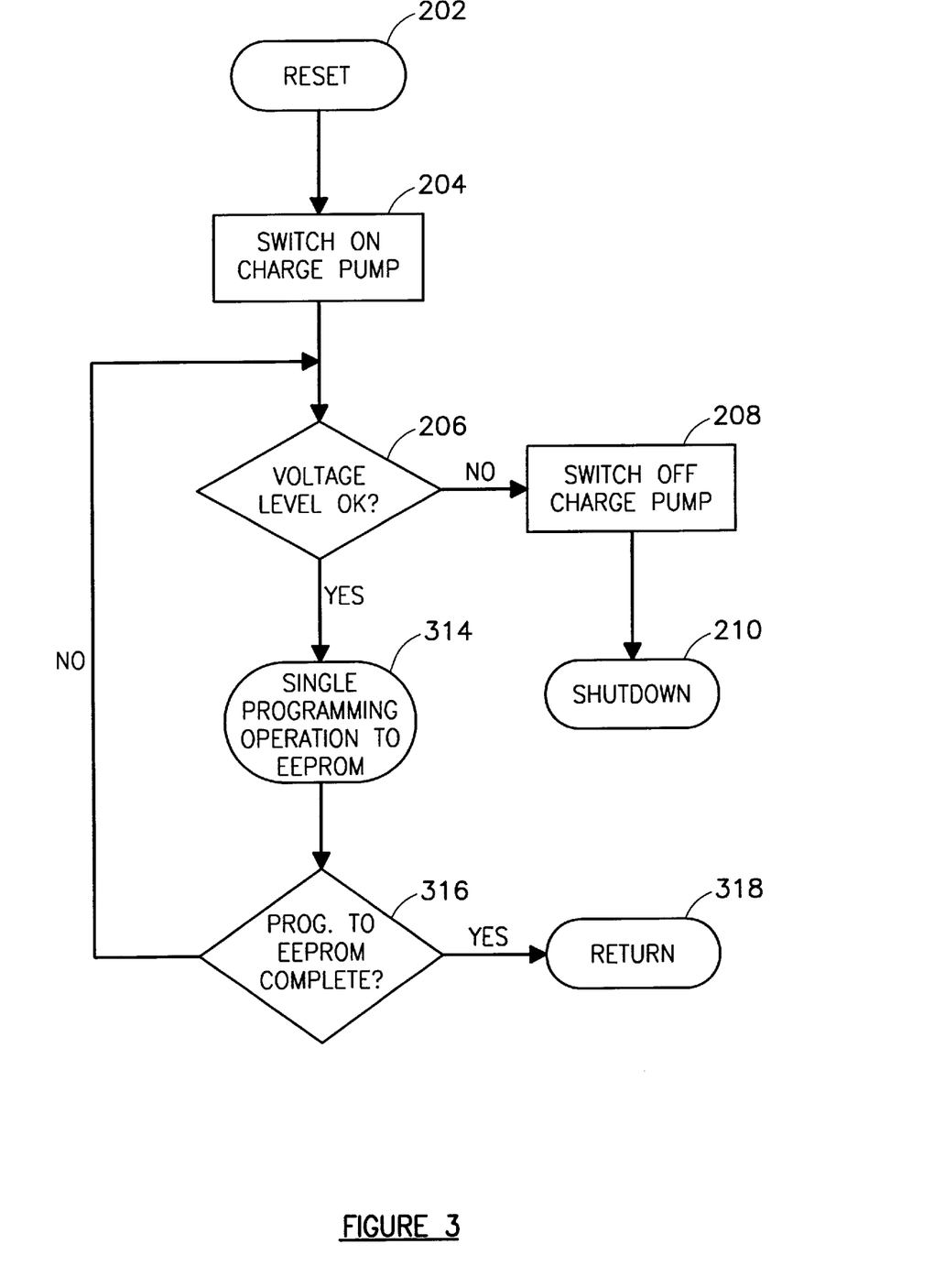
FIG. 3 is a schematic logic flow diagram of another embodiment of the invention wherein the charge pump voltage is checked before each programming operation.

Referring now to FIG. 3, a schematic logic flow diagram of another embodiment of the invention wherein the charge pump voltage is checked before each programming operation, is illustrated. In step 202, a reset or initialization is performed by the microcontroller core logic 102. In step 204 the microcontroller core logic 102 causes the charge pump 116 to switch on, thus placing a load on the battery 120. Additionally, in step 216 (FIG. 2), a test load may be connected to the output of the charge pump to simulate an EEPROM 112 programming load. The voltage level generated by the charge pump 116 is checked in step 206, and if at or greater than a desired voltage value, a single programming operation to the EEPROM 112 is enabled in step 314. A determination is made in step 316 whether there are further programming operations pending to the EEPROM 112.

If there are more programming operations pending, this embodiment will check the voltage level from the output of the charge pump 116 before enabling another programming operation to the EEPROM 112. In this way the output voltage level from the charge pump 116 is pre-qualified before any programming operation to the EEPROM 112 is allowed. In addition, this embodiment saves time and battery power because once the charge pump is enabled and a programming voltage is thereby generated, a programming operation may immediately proceed without having to perform additional voltage checks thereon.

If, however, the voltage level generated by the charge pump 116 is less than the desired voltage value before or between any of the programming operations, then the charge pump 116 is switched off in step 208 and the system is shutdown in step 210. It is contemplated and within the scope of the present invention that the system may also, alternatively, alarm or inhibit any attempted programming operation to the EEPROM 112.

Figure 4:
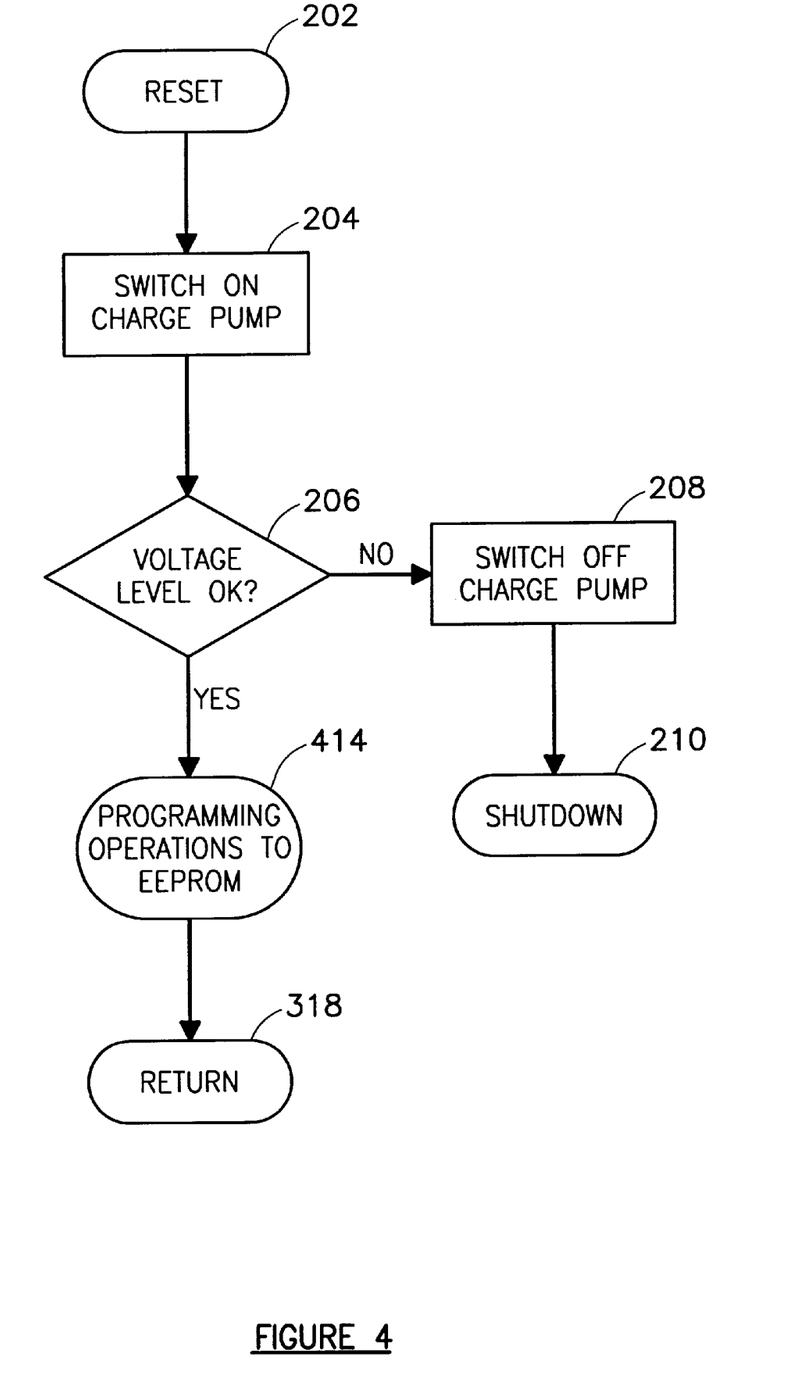
FIG. 4 is a schematic logic flow diagram of still another embodiment of the invention having multiple programming operations after first checking the charge pump voltage.

Referring to FIG. 4, a schematic logic flow diagram of still another embodiment of the invention, having multiple programming operations after first checking the charge pump voltage, is illustrated. In step 202, a reset or initialization is performed by the microcontroller core logic 102. In step 204 the microcontroller core logic 102 causes the charge pump 116 to switch on, thus placing a load on the battery 120. Additionally, in step 216 (FIG. 2), a test load may be connected to the output of the charge pump to simulate an EEPROM 112 programming operation load. The voltage level generated by the charge pump 116 is checked in step 206, and if it is at or greater than a desired voltage value, a programming operation (one or more) to the EEPROM 112 is enabled in step 414.

Once this embodiment checks that the voltage level from the output of the charge pump 116 is at or greater than a desired voltage value, any number of programming operations may proceed. This embodiment also saves time and battery power because once the charge pump is enabled and a programming voltage is thereby generated, multiple programming operations may immediately proceed without having to retest for the desired programming voltage.

If, however, the voltage level generated by the charge pump 116 is less than the desired voltage value before beginning the programming operation(s), then the charge pump 116 is switched off in step 208 and the system is shutdown in step 210. It is contemplated and within the scope of the present invention that the system may also, alternatively, alarm or inhibit any attempted programming operation to the EEPROM 112.

The invention, therefore, is well adapted to carry out the objects and attain the ends and advantages mentioned, as well as others inherent therein. While the invention has been depicted, described, and is defined by reference to particular preferred embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. An electronic system having an electrically erasable programmable read only memory (EEPROM), said system comprising:

a processor;

an analog-to-digital converter (ADC);

an EEPROM;

EEPROM programming logic; and a charge pump for generating an EEPROM programming voltage;

wherein the EEPROM programming voltage generated by said charge pump is converted from an analog value to a digital value by said ADC and the digital value of the EEPROM programming voltage is read by said processor to determine if the digital value is equal to or greater than a desired value; whereby, if the generated EEPROM programming voltage is equal to or greater than the desired value then said EEPROM programming logic is enabled to perform a programming operation on said EEPROM; and if the generated EEPROM programming voltage is less than the desired value then said EEPROM programming logic is inhibited from performing a programming operation on said EEPROM.

2. The system of claim 1, further adapted for connection to a battery power supply.

3. The system of claim 1, wherein said EEPROM programming logic performs a plurality of programming operations on said EEPROM once the EEPROM programming voltage has been determined to be equal to or greater than the desired value.

4. The system of claim 1, wherein said EEPROM programming logic performs one programming operation on said EEPROM after each time the EEPROM programming voltage has been determined to be equal to or greater than the desired value.

5. The system of claim 1, further comprising a random access memory (RAM), a read only memory (ROM) and input-output (I/O) interface circuits connected to said processor.

6. The system of claim 5, wherein said processor, EEPROM, EEPROM programming logic, charge pump, RAM, ROM and I/O interface circuits are fabricated on a single integrated circuit.

7. The system of claim 5, wherein said processor, EEPROM, EEPROM programming logic, charge pump, RAM, ROM and I/O interface circuits are fabricated on a plurality of integrated circuits.

8. The system of claim 7, wherein said plurality of integrated circuits are interconnected with a wiring substrate selected from the group consisting of a printed circuit board and a printed wiring board.

9. A method for preventing soft programming to an electrically erasable programmable read only memory (EEPROM) in an electronic system, said method comprising the steps of:

generating an EEPROM programming voltage;

determining with an analog-to-digital converter (ADC) and a processor if the generated EEPROM programming voltage is equal to or greater than a desired value;

if so, enabling an EEPROM programming logic for programming an EEPROM, and if not, disabling the EEPROM programming logic to prevent programming the EEPROM.

10. The method of claim 9, wherein the step of generating an EEPROM programming voltage is done with a charge pump.

11. The method of claim 9, after the step of enabling the EEPROM programming logic, further comprising the step of performing a single programming operation to the EEPROM.

12. The method of claim 9, after the step of enabling the EEPROM programming logic, further comprising the step of performing a plurality of programming operations to the EEPROM.

13. The method of claim 11, after the step of performing a single programming operation to the EEPROM, further comprising repeating the steps of determining if the generated EEPROM programming voltage is equal to or greater than the desired value, enabling the EEPROM programming logic and performing a single programming operation until all data has been written to the EEPROM.

14. A method for programming an electrically erasable programmable read only memory (EEPROM) in an electronic system, said method comprising the steps of:

generating an EEPROM programming voltage by switching on a charge pump;

determining with an analog-to-digital converter (ADC) and a processor if the generated EEPROM programming voltage is equal to or greater than a desired value;

if so, turning off the charge pump and continuing normal operation of the electronic system, and if not, turning off the charge pump and alerting the electronic system of a low generated EEPROM programming voltage.

15. The method of claim 14, after the step of continuing normal operation of the electronic system, further comprising the steps of:

switching on the charge pump for generating the EEPROM programming voltage; and programming the EEPROM.

16. The method of claim 14, wherein the step of alerting the electronic system of a low generated EEPROM programming voltage includes the step of shutting down the electronic system.

17. A method for programming an electrically erasable programmable read only memory (EEPROM) in an electronic system, said method comprising the steps of:

(a) generating an EEPROM programming voltage by switching on a charge pump;

(b) determining with an analog-to-digital converter (ADC) and a processor if the generated EEPROM programming voltage is equal to or greater than a desired voltage value;

(c) if so, doing a single programming operation to the EEPROM and then returning to step (b) until all pending programming operations to the EEPROM are finished, and (d) if not, turning off the charge pump and alerting the electronic system of a low generated EEPROM programming voltage.

18. A method for programming an electrically erasable programmable read only memory (EEPROM) in an electronic system, said method comprising the steps of:

(a) generating an EEPROM programming voltage by switching on a charge pump;

(b) determining with an analog-to-digital converter (ADC) and a processor if the generated EEPROM programming voltage is equal to or greater than a desired voltage value;

(c) if so, doing a plurality of programming operations to the EEPROM until all pending programming operations to the EEPROM are finished, and (d) if not, turning off the charge pump and alerting the electronic system of a low generated EEPROM programming voltage.

19. An apparatus for preventing soft programming to an electrically erasable programmable read only memory (EEPROM), said apparatus comprising:

a charge pump for generating an EEPROM programming voltage;

an analog-to-digital converter (ADC) and a processor for determining if the generated EEPROM programming voltage is at least a desired voltage level; and a circuit adapted to inhibit EEPROM programming logic if the EEPROM programming voltage is not at least the desired voltage level.

20. The apparatus of claim 19, further comprising an alarm signal for alerting an electronic system when the EEPROM programming voltage is not at least the desired voltage level.

21. The apparatus of claim 19, further adapted for connection to a battery power supply.

22. The system of claim 1, wherein the logic for enabling said charge pump is said processor controlled by a software program.

23. The system of claim 1, wherein the logic for enabling said charge pump is an application specific circuit logic.

24. The system of claim 23, wherein the application specific circuit logic is controlled by firmware.

25. The system of claim 1, wherein the logic for enabling said charge pump is said processor controlled by firmware.

26. The system of claim 1, further comprising a test load connected to said charge pump when determining if the generated EEPROM programming voltage is equal to or greater than the desired value.

27. The system of claim 26, wherein said test load is connected to said charge pump by addressing said test load outside of said EEPROM address space.

28. The system of claim 6, wherein the processor is microcontroller core logic.

29. The system of claim 1, wherein the processor is a microprocessor.

30. The system of claim 1, wherein the processor is a plurality of microprocessors.

31. The system of claim 1, wherein the processor is a digital signal processor.

32. The system of claim 1, wherein the processor comprises digital logic.

33. The system of claim 1, wherein the processor comprises a programmable logic array.

34. The system of claim 1, wherein the EEPROM is flash ROM.

35. The method of claim 9, wherein the step of generating an EEPROM programming voltage further comprises the step of applying a test load to the generated EEPROM programming voltage.

36. The method of claim 35, wherein the step of applying a test load comprises the step of addressing the test load outside of the EEPROM address space.

37. The method of claim 14, wherein the step of generating an EEPROM programming voltage further comprises the step of applying a test load to the generated EEPROM programming voltage.

38. The method of claim 17, wherein the step of generating an EEPROM programming voltage further comprises the step of applying a test load to the generated EEPROM programming voltage.

39. The method of claim 18, wherein the step of generating an EEPROM programming voltage further comprises the step of applying a test load to the generated EEPROM programming voltage.

40. The system of claim 1, wherein the processor is a microcontroller.

41. An electronic system having an electrically erasable programmable read only memory (EEPROM), said system comprising:

an EEPROM;

EEPROM programming logic;

a test load; and a charge pump for generating an EEPROM programming voltage;

wherein, said test load is connected to said charge pump when the generated EEPROM programming voltage is being measured to determine if it is equal to or greater than a desired value; whereby, if the generated EEPROM programming voltage is equal to or greater than the desired value then said EEPROM programming logic is enabled to perform a programming operation on said EEPROM; and if the generated EEPROM programming voltage is less than the desired value then said EEPROM programming logic is inhibited from performing a programming operation on said EEPROM.

42. A method for preventing soft programming to an electrically erasable programmable read only memory (EEPROM) in an electronic system, said method comprising the steps of:

generating an EEPROM programming voltage;

applying a test load to the generated EEPROM programming voltage when determining if the generated EEPROM programming voltage is equal to or greater than a desired value;

if so, enabling an EEPROM programming logic for programming an EEPROM without applying the test load, and if not, disabling the EEPROM programming logic to prevent programming the EEPROM.

43. A method for programming an electrically erasable programmable read only memory (EEPROM) in an electronic system, said method comprising the steps of:

generating an EEPROM programming voltage by switching on a charge pump;

applying a test load to the generated EEPROM programming voltage when determining if the generated EEPROM programming voltage is equal to or greater than a desired voltage value;

if so, turning off the charge pump and continuing normal operation of the electronic system, and if not, turning off the charge pump and alerting the electronic system of a low generated EEPROM programming voltage.

44. The method of claim 43, after the step of continuing normal operation of the electronic system, further comprising the steps of:

switching on the charge pump for generating the EEPROM programming voltage without applying the test load; and programming the EEPROM.

45. A method for programming an electrically erasable programmable read only memory (EEPROM) in an electronic system, said method comprising the steps of:

(a) generating an EEPROM programming voltage by switching on a charge pump;

(b) applying a test load to the generated EEPROM programming voltage when determining if the generated EEPROM programming voltage is equal to or greater than a desired voltage value;

(c) if the generated EEPROM programming voltage is equal to or greater than a desired voltage value, then doing a single programming operation to the EEPROM and returning to step (b) until all pending programming operations to the EEPROM are finished, and (d) if not, turning off the charge pump and alerting the electronic system of a low generated EEPROM programming voltage.

46. A method for programming an electrically erasable programmable read only memory (EEPROM) in an electronic system, said method comprising the steps of:

(a) generating an EEPROM programming voltage by switching on a charge pump;

(b) applying a test load to the generated EEPROM programming voltage when determining if the generated EEPROM programming voltage is equal to or greater than a desired voltage value;

(c) if the generated EEPROM programming voltage is equal to or greater than a desired voltage value, then doing a plurality of programming operations to the EEPROM and, and (d) if not, turning off the charge pump and alerting the electronic system of a low generated EEPROM programming voltage.

47. An apparatus for preventing soft programming to an electrically erasable programmable read only memory (EEPROM), said apparatus comprising:

a charge pump for generating an EEPROM programming voltage;

a circuit for determining if the generated EEPROM programming voltage is at least a desired voltage level;

a test load, said test load being connected to the charge pump generated EEPROM programming voltage when determining if the generated EEPROM programming voltage is at least the desired voltage level; and a circuit adapted to inhibit EEPROM programming logic if the EEPROM programming voltage is not at least the desired voltage level.

48. The apparatus of claim 19, further comprising a test load connected to said charge pump when determining if the generated EEPROM programming voltage is equal to or greater than the desired value.

* * * * *